United States Patent
Brask et al.

(10) Patent No.: US 7,129,182 B2
(45) Date of Patent: Oct. 31, 2006

(54) METHOD FOR ETCHING A THIN METAL LAYER

(75) Inventors: Justin K. Brask, Portland, OR (US); Mark L. Doczy, Beaverton, OR (US); Jack Kavalieros, Portland, OR (US); Uday Shah, Portland, OR (US); Matthew V. Metz, Hillsboro, OR (US); Robert S. Chau, Beaverton, OR (US); Robert B. Turkot, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 10/704,498

(22) Filed: Nov. 6, 2003

(65) Prior Publication Data

US 2005/0101134 A1 May 12, 2005

(51) Int. Cl.
*H01L 21/302* (2006.01)
(52) U.S. Cl. .................. 438/745; 438/750; 438/754
(58) Field of Classification Search ............... 438/745, 438/750, 754; 252/79.1, 79.4
See application file for complete search history.

(56) References Cited

U.S. PATENT DOCUMENTS

| | | | |
|---|---|---|---|
| 5,466,389 A * | 11/1995 | Ilardi et al. ............... 510/175 |
| 5,625,217 A | 4/1997 | Chau et al. ............... 257/412 |
| 5,753,560 A | 5/1998 | Hong et al. ............... 438/402 |
| 5,783,478 A | 7/1998 | Chau et al. ............... 438/592 |
| 5,891,798 A | 4/1999 | Doyle et al. ............... 438/624 |
| 5,972,123 A * | 10/1999 | Verhaverbeke ............ 134/3 |
| 6,015,505 A * | 1/2000 | David et al. ............... 252/79.2 |
| 6,063,698 A | 5/2000 | Tseng et al. ............... 438/585 |
| 6,087,261 A | 7/2000 | Nishikawa et al. ......... 438/685 |
| 6,121,094 A | 9/2000 | Gardner et al. ............. 438/287 |
| 6,184,072 B1 | 2/2001 | Kaushik et al. ............. 438/197 |
| 6,306,742 B1 | 10/2001 | Doyle et al. ............... 438/591 |
| 6,358,788 B1 * | 3/2002 | Chen et al. ............... 438/238 |
| 6,391,802 B1 | 5/2002 | Delpech et al. ............ 438/785 |
| 6,420,279 B1 | 7/2002 | Ono et al. ............... 438/785 |
| 6,436,777 B1 | 8/2002 | Ota ......................... 438/305 |
| 6,475,874 B1 | 11/2002 | Xiang et al. ............... 438/396 |
| 6,514,828 B1 | 2/2003 | Ahn et al. ............... 438/240 |
| 6,544,906 B1 | 4/2003 | Rotondaro et al. ......... 438/785 |
| 6,565,763 B1 * | 5/2003 | Asakawa et al. ........... 216/56 |
| 6,617,209 B1 | 9/2003 | Chau et al. ............... 438/240 |
| 6,617,210 B1 | 9/2003 | Chau et al. ............... 438/240 |
| 6,642,131 B1 | 11/2003 | Harada ..................... 438/591 |
| 6,667,246 B1 | 12/2003 | Mitsuhashi et al. ......... 438/756 |
| 6,727,188 B1 * | 4/2004 | Jo et al. ................... 438/745 |
| 6,770,564 B1 * | 8/2004 | Ito et al. ................... 438/706 |
| 6,794,234 B1 | 9/2004 | Polishchuk et al. ......... 438/199 |
| 6,809,034 B1 * | 10/2004 | Ito et al. ................... 438/706 |
| 6,902,969 B1 * | 6/2005 | Adetutu et al. ............. 438/199 |

(Continued)

OTHER PUBLICATIONS

Polishchuk et al. "Dual Workfunction CMOS Gate Technology Based on Metal Interdiffusion," www.eesc.berkeley.edu, 1 page.

(Continued)

*Primary Examiner*—Kin-Chan Chen
(74) *Attorney, Agent, or Firm*—Blakey, Sokoloff, Taylor & Zafman LLP

(57) ABSTRACT

A method for etching a metal layer is described. That method comprises forming a metal layer on a substrate, then exposing part of the metal layer to a wet etch chemistry that comprises an active ingredient with a diameter that exceeds the thickness of the metal layer.

25 Claims, 5 Drawing Sheets

U.S. PATENT DOCUMENTS

| | | | |
|---|---|---|---|
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2004/0191974 A1* | 9/2004 | Gilmer et al. | 438/199 |

OTHER PUBLICATIONS

Doug Barlage et al., "High-Frequency Response of 100nm Integrated CMOS Transistors with High-K Gate Dielectrics", 2001 IEEE, 4 pages.

Robert Chau et al., A 50nm Depleted-Substrate CMOS Transistor (DST), 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Parker et al., "A Method of Making Semiconductor Device Having a High-K Gate Dielectric", U.S. Appl. No. 10/285,915, filed Oct. 31, 2002.

Chau et al., "A Method of Making Semiconductor Device Having a High-K Gate Dielectric", U.S. Appl. No. 10/288, 043, filed Nov. 5, 2002.

Parker et al., "A Method of Making Semiconductor Device Having a High-K Gate Dielectric", U.S. Appl. No. 10/315,268, filed Dec. 10, 2002.

Doczy et al., "A Method of Making Semiconductor Device Having a High-K Gate Dielectric", U.S. Appl. No. 10/338,174, filed Jan. 7, 2003.

Brask et al., "A Method of Making Semiconductor Device Having a High-K Gate Dielectric", U.S. Appl. No. 10/387,303, filed Mar. 11, 2003.

Brask et al., "A Method of Making Semiconductor Device Having a High-K Gate Dielectric", U.S. Appl. No. 10/391,816, filed Mar. 18, 2003.

Chau et al., "A Method for Making a Semiconductor Device Having a Metal Gate Electrode", U.S. Appl. No. 10/431,166, filed May 6, 2003.

Brask, et al, "A Method for Making a Semiconductor Device Having a High-K Gate Dielectric", U.S. Appl. No. 10/441,616, filed May 20, 2003.

Brask et al. "A Selective Etch Process for Making a Semiconductor Device Having a High-K Gate Dielectric," U.S. Appl. No. 10/652,546, filed Aug. 28, 2003.

Brask et al. "A Method for Making a Semiconductor Device Having a High-K Gate Dielectric," U.S. Appl. No. 10/642,796, filed Aug. 28, 2003.

Brask, "Methods and Compositions for Selectively Etching Metal Films and Structures," U.S. Appl. No. 10/658,225, filed Sep. 8, 2003.

* cited by examiner

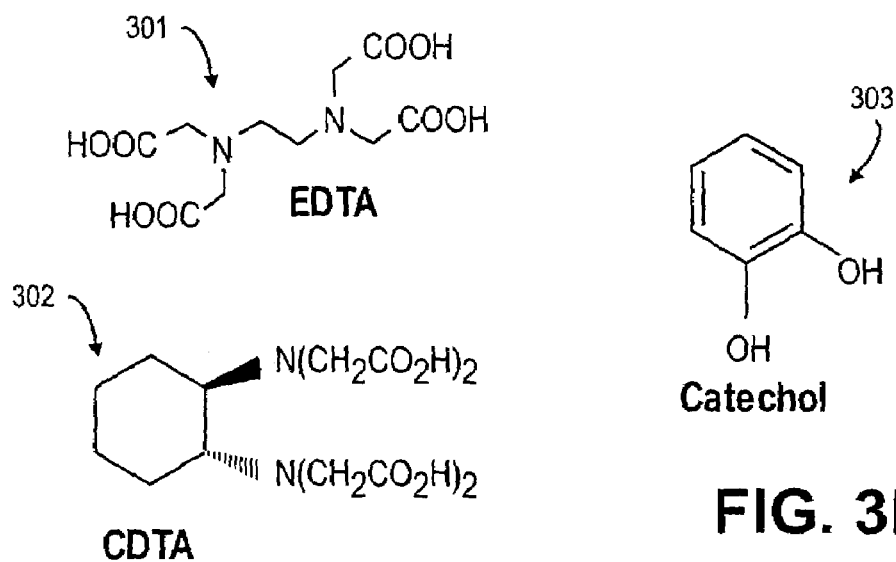
FIG. 3A
FIG. 3B
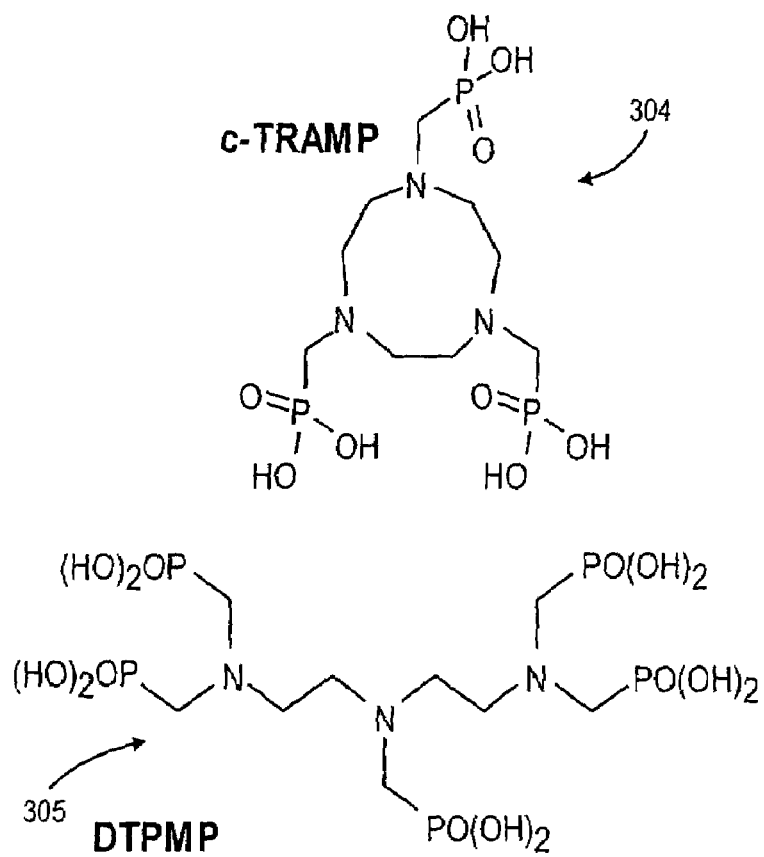
FIG. 3C

METHOD FOR ETCHING A THIN METAL LAYER

FIELD OF THE INVENTION

The present invention relates to methods for etching metal layers, in particular, those formed when making semiconductor devices.

BACKGROUND OF THE INVENTION

It may be desirable to use a metal gate electrode when making a MOS field-effect transistor that includes a high-k gate dielectric. When forming such a metal gate electrode, it may be necessary to remove portions of a previously deposited very thin metal layer. As shown in FIG. 1a, patterned masking layer 102 may define sections of metal layer 101 to be removed. If a wet etch process is applied to remove part of metal layer 101, that process may etch metal layer 101 isotropically. As a consequence, part of metal layer 101 may be etched from beneath masking layer 102, as FIG. 1b illustrates. The resulting undercut may have adverse consequences.

Accordingly, there is a need for an improved process for etching a very thin metal layer. There is a need for such a process that may enable part of such a layer to be removed, without removing significant portions of it from beneath an overlying masking layer. The method of the present invention provides such a process.

BRIEF DESCRIPTION OF THE DRAWINGS

FIGS. 3a–3c identify hexa-dentate chelating agents that may be used in an embodiment of the method of the present invention.

Features shown in these figures are not intended to be drawn to scale.

DETAILED DESCRIPTION OF THE PRESENT INVENTION

A method for etching a metal layer is described. That method comprises forming a metal layer on a substrate, then exposing part of the metal layer to a wet etch chemistry that comprises an active ingredient with a diameter that exceeds the thickness of the metal layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 2A:
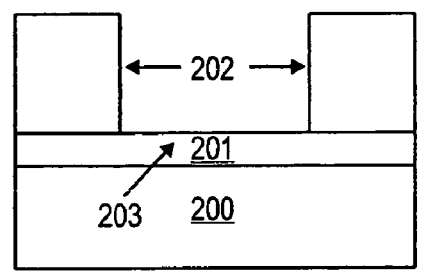
FIGS. 2a–2b represent cross-sections of structures that may be formed when carrying out an embodiment of the method of the present invention.
Figure 2B:
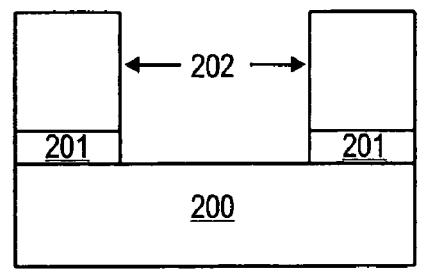

FIGS. 2a–2b illustrate structures that may be formed, when carrying out an embodiment of the method of the present invention. Initially, metal layer 201 is formed on substrate 200. Masking layer 202 is then deposited and patterned to generate the FIG. 2a structure. Metal layer 201 preferably is less than about 100 angstroms thick, and more preferably is between about 25 angstroms and about 50 angstroms thick. Metal layer 201 may comprise any metal that may be etched. Examples of such metals include: hafnium, zirconium, titanium, tantalum, aluminum, ruthenium, palladium, platinum, cobalt, nickel, metal carbides and conductive metal oxides. Metal layer 201 may be formed on substrate 200 using a conventional PVD or CVD process, as will be apparent to those skilled in the art. Masking layer 202 preferably comprises a silicon nitride or silicon dioxide hard mask, which may be deposited and patterned in the conventional manner.

After masking layer 202 is patterned, exposed part 203 of metal layer 201 is removed, generating the FIG. 2b structure. In the method of the present invention, exposed part 203 of metal layer 201 is removed using a wet etch chemistry that comprises an active ingredient. That active ingredient preferably comprises an etchant that is associated with a sufficient number of water molecules to solubilize the etchant. The resulting complex—which may have a quasi-spherical configuration and may be identified as a "hydrated etchant"—must have a diameter that exceeds the thickness of metal layer 201.

In a particularly preferred embodiment, a wet etch chemistry comprising an aqueous solution that includes a chelating agent (e.g., an organic compound that may bind to a metal ion to form a chelate) is applied to exposed part 203 of metal layer 201 to remove that part of that layer. Examples of potentially useful chelating agents include those that have been employed to remove metallic contaminants from semiconductor substrates. Particularly preferred are hexa-dentate chelating agents (i.e., chelating agents with six bonding atoms). FIGS. 3a–3c identify some hexa-dentate chelating agents that may be used, including carboxylic acid based chelating agents 301 and 302 (EDTA and CDTA, respectively); catechol 303 (representative of phenol derivatives that may be used); and phosphonic acid based chelating agents 304 and 305 (c-TRAMP and DTPMP). When such well known chelating agents are added to an aqueous solution to etch metal layer 201, they should be included at a concentration of between about 0.5 and about 5.0 moles/liter.

Figure 1A:
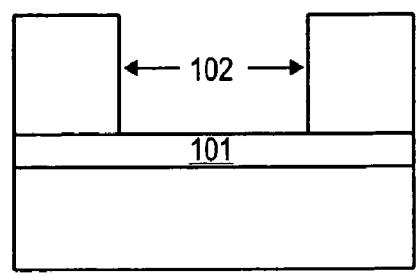
FIGS. 1a–1b illustrate a process for etching a metal layer.
Figure 1B:
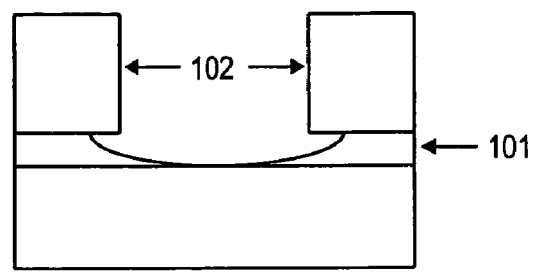

In contrast to the method that FIGS. 1a–1b illustrate, the method described above ensures that significant amounts of metal layer 201 will not be removed from beneath masking layer 202, when exposed part 203 of metal layer 201 is removed. In a preferred embodiment, less than about 100 angstroms of metal layer 201 are removed from beneath masking layer 202, when exposed part 203 of metal layer 201 is removed. In a more preferred embodiment, less than about 50 angstroms of metal layer 201 are removed from beneath masking layer 202, when exposed part 203 of metal layer 201 is removed.

Figure 4A:
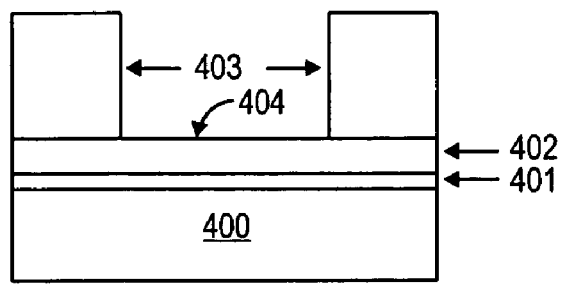
FIGS. 4a–4c represent cross-sections of structures that may be formed when carrying out a second embodiment of the method of the present invention.
Figure 4B:
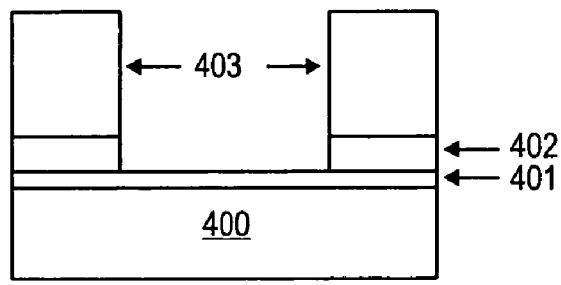
Figure 4C:
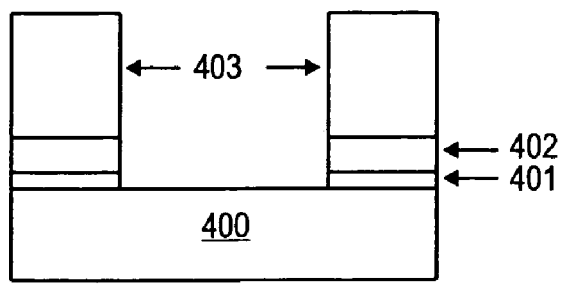

FIGS. 4a–4c illustrate a process for making a semiconductor device that employs the method of the present invention. Initially, high-k gate dielectric layer 401 is formed on substrate 400, and metal layer 402 is formed on high-k gate dielectric layer 401. Part of metal layer 402 is then masked by masking layer 403—generating the FIG. 4a structure.

Substrate 400 may comprise any material upon which a semiconductor device may be built. High-k gate dielectric layer 401 may comprise, for example, hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, or lead zinc niobate. Particularly preferred are hafnium oxide, zirconium oxide, and aluminum oxide. Metal layer 402 may comprise any conductive material from which a metal gate electrode may be derived. In this regard, metal layer 402 may comprise one of the materials identified above in connection with metal layer 201.

High-k gate dielectric layer 401 and metal layer 402 may be formed on substrate 400 using conventional PVD and CVD deposition methods. A conventional atomic layer CVD process preferably is used to deposit high-k gate dielectric layer 401. High-k gate dielectric layer 401 preferably is between about 5 angstroms and about 40 angstroms thick. Metal layer 402 preferably is less than about 100 angstroms thick, and more preferably is between about 25 angstroms and about 50 angstroms thick. Masking layer 403 may comprise a polysilicon layer, which may be deposited and patterned using conventional deposition, photolithography and etch techniques.

A wet etch chemistry that comprises an aqueous solution that contains a chelating agent may be applied to exposed part 404 of metal layer 402 to remove that part of that layer, and to generate the FIG. 4b structure. As in the embodiment described above, hexa-dentate chelating agents may be used to etch metal layer 402. Removing exposed portion 404 of metal layer 402 using a wet etch chemistry that includes such a chelating agent may enable metal layer 402 to be etched selectively to high-k gate dielectric layer 401, without significantly etching that metal layer from beneath masking layer 403. After metal layer 402 is etched, the exposed portion of high-k gate dielectric layer 401 may be removed using any etch process suitable for removing such a layer, yielding the FIG. 4c structure.

Figure 5A:
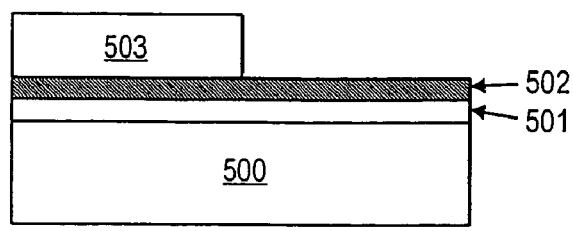
FIGS. 5a–5g represent cross-sections of structures that may be formed when carrying out a third embodiment of the method of the present invention.
Figure 5B:
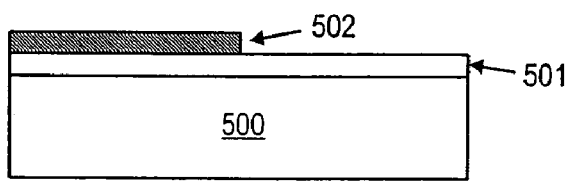

FIGS. 5a–5g illustrate a process for making a CMOS semiconductor device that employs the method of the present invention. FIG. 5a represents a cross-section of a structure that includes: high-k gate dielectric layer 501, which is formed on substrate 500; first metal layer 502, which is formed on high-k gate dielectric layer 501; and masking layer 503, which is formed on first metal layer 502.

High-k gate dielectric layer 501 may comprise one of the materials identified above. In one embodiment, first metal layer 502 comprises an n-type metal, for example: hafnium, zirconium, titanium, tantalum, aluminum, and metal carbides that include these elements. First metal layer 502 may be formed on high-k gate dielectric layer 501 using a well known PVD or CVD process, and preferably is between about 25 angstroms and about 50 angstroms thick. When first metal layer 502 comprises an n-type material, that layer preferably has a workfunction that is between about 3.9 eV and about 4.2 eV.

Dopants may be added to first metal layer 502, as it is formed or after it is formed, to shift layer 502's workfunction to ensure that it falls within the desired range. The optimal concentration of any dopant that is added to first metal layer 502 to shift its workfunction to a targeted level may depend upon the composition and properties of layer 502 (including its initial workfunction), the type of dopant used, and the target workfunction. Metal layers that are doped as, or after, they are deposited fall within the definition of "metal layer," as that term is used in this application.

Masking layer 503 may be formed from conventional materials, e.g., silicon nitride or silicon dioxide, using conventional techniques. After masking layer 503 is deposited on layer 502, conventional photolithography and etch processes may be applied to remove part of masking layer 503, exposing a first portion of first metal layer 502 and yielding the FIG. 5a structure.

After patterning masking layer 503, a first portion of first metal layer 502 is removed, leaving part of high-k gate dielectric layer 501 exposed. A plasma dry etch process, e.g., one using a chlorine based plasma, may be applied to remove a first portion of layer 502 selective to high-k gate dielectric layer 501. Although a dry etch process is preferred, a wet etch process may be used instead as long as it does not remove a significant amount of layer 502 from beneath masking layer 503. After first metal layer 502 is etched, the remainder of masking layer 503 is removed, generating the FIG. 5b structure.

Figure 5C:
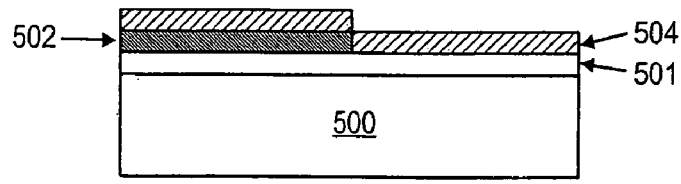

In this embodiment, second metal layer 504 is then deposited on first metal layer 502 and on the exposed portion of high-k gate dielectric layer 501—generating the structure illustrated by FIG. 5c. When first metal layer 502 comprises an n-type metal, second metal layer 504 preferably comprises a p-type metal. Examples of potentially suitable p-type metals for forming second metal layer 504 include: ruthenium, palladium, platinum, cobalt, nickel, and conductive metal oxides, e.g., ruthenium oxide.

Second metal layer 504 may be formed on high-k gate dielectric layer 501 and first metal layer 502 using a conventional PVD or CVD process, and preferably is between about 25 angstroms and about 50 angstroms thick. When second metal layer 504 comprises a p-type material, layer 504 preferably has a workfunction that is between about 4.9 eV and about 5.2 eV.

As with first metal layer 502, dopants may be added to second metal layer 504 to shift layer 504's workfunction to the desired level. In some embodiments, first metal layer 502 and second metal layer 504 may each comprise the same mid-gap metal, e.g., titanium nitride or tantalum nitride. The workfunction of a layer that includes such a mid-gap metal may be shifted up or down by adding an element to that layer that has a relatively low electronegativity or a relatively high electronegativity. When an n-type metal is desired for first metal layer 502, the workfunction of that layer may be shifted to about 4.2 eV or less by adding to a mid-gap metal an element with a relatively low electronegativity, e.g., aluminum. When a p-type metal is desired for second metal layer 504, the workfunction of that layer may be shifted to about 4.9 eV or higher by adding to a mid-gap metal an element with a relatively high electronegativity, e.g., chlorine.

Although a few examples of materials that may be used to form first and second metal layers 502 and 504 are described here, those layers may be made from many other materials. The term "metal layer," as applied in this embodiment, thus encompasses any conductive material from which a metal gate electrode may be derived.

Figure 5D:
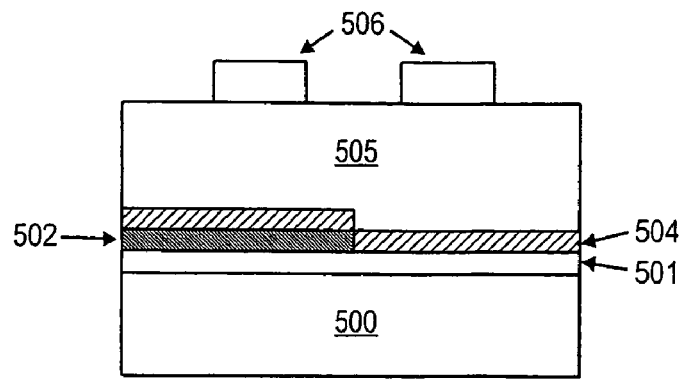

After depositing second metal layer 504 on first metal layer 502 and high-k gate dielectric layer 501, masking layer 505 is deposited on second metal layer 504. Masking layer 506 is then formed on masking layer 505 and patterned to define sections of masking layer 505 to be removed and sections to be retained. FIG. 5d represents a cross-section of the structure that results after masking layer 506 is deposited on masking layer 505, and then patterned.

In a preferred embodiment, masking layer 505 comprises a polysilicon containing layer, which may be deposited using conventional methods and which preferably is between about 500 angstroms and about 2,000 angstroms thick. Such a polysilicon layer may be undoped or doped with either n-type or p-type impurities. Layer 506 may comprise conventional materials, e.g., silicon nitride or silicon dioxide, and may be deposited and patterned using conventional techniques.

Figure 5E:
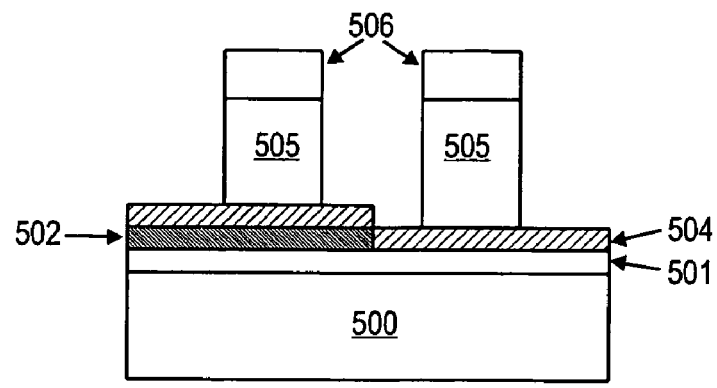

After layer 506 is patterned, a first portion of layer 505 is removed selective to second metal layer 504 to expose part of layer 504 and to create the FIG. 5e structure. A dry etch process may be used to etch layer 505. Such a dry etch process may employ a plasma that is derived from sulfur hexafluoride, hydrogen bromide, hydrogen iodide, chlorine, argon, oxygen and/or helium. The optimal process for etching layer 505 may depend upon the material used for second metal layer 504, the degree to which layer 505 is doped, and the desired profile for the resulting etched layer.

Figure 5F:
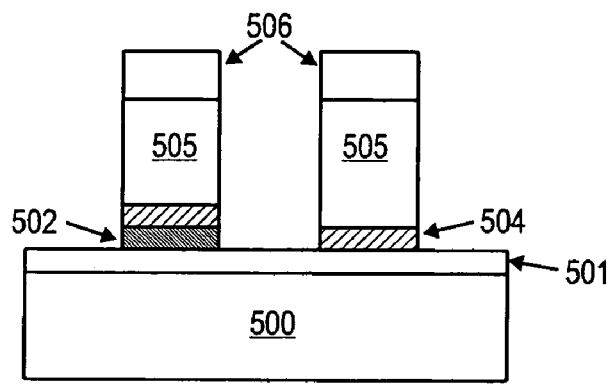

The exposed portion of second metal layer 504 and the underlying portion of first metal layer 502 are then removed, to generate the FIG. 5f structure. To prevent that process step from removing significant portions of layers 504 and 502 from beneath masking layer 505, layers 504 and 502 are removed with a wet etch process that employs a chelating agent, like those identified above. When such well known chelating agents are added to an aqueous solution to etch metal layers 504 and 502, they should be included at a concentration of between about 0.5 and about 5.0 moles/liter.

Depending upon the materials used for metal layers 504 and 502 and for high-k gate dielectric layer 501, it may be desirable to modify the chelating agents described above (or to employ other types of chelating agents) to ensure that layers 504 and 502 are etched selectively to layer 501. A chelating agent that is tailored to bind with ions of a specific metal may selectively etch a layer that includes that metal without significantly etching an underlying film having a different composition. In this respect, parts of a chelating agent, e.g., aryl or alkyl groups, may be modified to enhance its ability to bind to a specific metal (or metals) to enable selective etching of that metal.

When second metal layer 504 and first metal layer 502 comprise multiple components, a wet etch chemistry for etching those layers may include multiple chelating agents—with different agents having an affinity to bind to different components that are contained in those layers. The relative concentration of each chelating agent included in such a solution may be proportional to the relative amounts of each component included in the metal layers.

The chelating agent or agents selected for the wet etch chemistry used to etch layers 504 and 502 should be combined with a suitable solvent to maximize etch selectively. The best solvent for etching layers 504 and 502 selectively to layer 501 may be de-ionized water. In other embodiments, the optimum solvent may be acidic or basic, and may comprise many types of polar and/or nonpolar components, depending upon the composition of layers 504, 502, and 501. Although in a preferred embodiment, the same wet etch chemistry is used to etch both layers 504 and 502, different wet etch chemistries may be used to etch those layers.

When the combination of layers 504 and 502 is less than about 100 angstroms thick, exposing those layers to a wet etch chemistry that includes a chelating agent or agents may etch those layers selectively to high-k gate dielectric layer 501, without significantly etching those materials from beneath masking layer 505. In a preferred embodiment, using such a wet etch chemistry to etch layers 504 and 502 ensures that less than about 100 angstroms of those layers will be removed from beneath masking layer 505. In an even more preferred embodiment, such an etch process will undercut masking layer 505 by less than about 50 angstroms.

Figure 5G:
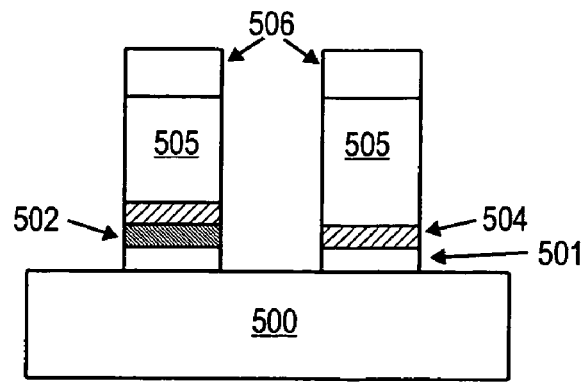

After metal layers 504 and 502 are etched, the exposed portion of high-k gate dielectric layer 501 is removed, generating the FIG. 5g structure. Process steps for completing the device that follow the dielectric layer etch, e.g., forming source and drain regions and the device's contacts, are well known to those skilled in the art and will not be described in more detail here. In this regard, using a dummy doped polysilicon layer for masking layer 505 may enable one to apply commonly used nitride spacer, source/drain, and silicide formation techniques, when completing the structure.

The order in which metal layers of different conductivity type are deposited is unimportant. As illustrated, first metal layer 502 may comprise an n-type metal, and second metal layer 504 may comprise a p-type metal. Alternatively, first metal layer 502 may comprise a p-type metal, and second metal layer 504 may comprise an n-type metal.

As illustrated above, the method of the present invention enables an exposed portion of a very thin metal layer to be etched without removing significant portions of that layer where located beneath a masking layer. Although the embodiments described above provide examples of processes for carrying out this method, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming a high-k gate dielectric layer on a substrate;
    forming a metal layer on said high-k gate dielectric layer;
    forming a masking layer on said metal layer, exposing part of said metal layer; and
    applying a wet etch chemistry that comprises an aqueous solution that includes between about 0.5 and about 5.0 moles/liter of at least one active etching ingredient, wherein said exposed part of said metal layer is removed from said high-k gate dielectric layer by said at least one active etching ingredient, wherein all active etching ingredients have a diameter that exceeds the thickness of said metal layer, and wherein removal of said metal layer underneath said masking layer is blocked by said masking layer.

2. The method of claim 1 wherein said metal layer comprises a material selected from the group consisting of hafnium, zirconium, titanium, tantalum, aluminum, ruthenium, palladium, platinum, cobalt, nickel, a metal carbide, and a conductive metal oxide.

3. The method of claim 1 wherein said high-k gate dielectric layer comprises a material selected from the group consisting of hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate.

4. The method of claim 1 wherein said masking layer comprises polysilicon.

5. The method of claim 1 wherein said metal layer is between about 25 angstroms and about 50 angstroms thick.

6. A method for making a semiconductor device comprising:
    forming a high-k gate dielectric layer on a substrate;

forming a metal layer on said high-k gate dielectric layer, said metal layer being between about 25 angstroms and about 50 angstroms thick;

forming a polysilicon containing layer on said metal layer;

removing a first portion of said polysilicon layer to expose part of said metal layer; and applying a wet etch chemistry that comprises an aqueous solution that includes between about 0.5 and about 5.0 moles/liter of at least one active etching ingredient to remove said exposed part of said metal layer from said high-k gate dielectric layer, wherein all active etching ingredients have a diameter that exceeds the thickness of said metal layer, and wherein removal of said metal layer underneath said polysilicon containing layer is blocked by said polysilicon containing layer.

7. The method of claim 6 wherein said high-k gate dielectric layer comprises a material selected from the group consisting of hafnium oxide, zirconium oxide, and aluminum oxide.

8. The method of claim 6 wherein said metal layer has a workfunction that is between about 3.9 eV and about 4.2 eV.

9. The method of claim 6 wherein said metal layer has a workfunction that is between about 4.9 eV and about 5.2 eV.

10. The method of claim 6 wherein at least one active etching ingredient is a hexa-dentate chelating agent that is selected from the group consisting of carboxylic acid based chelating agents, phosphonic acid based chelating agents, and phenol derivatives.

11. A method for making a semiconductor device comprising:

forming a high-k gate dielectric layer on a substrate, said high-k gate dielectric layer comprising a material selected from the group consisting of hafnium oxide, zirconium oxide, and aluminum oxide;

forming a first metal layer on said high-k gate dielectric layer, said first metal layer being between about 25 angstroms and about 50 angstroms thick;

removing a first portion of said first metal layer;

forming a second metal layer on said high-k gate dielectric layer, said second metal layer being between about 25 angstroms and about 50 angstroms thick, a first portion of said second metal layer covering the remaining portion of said first metal layer and a second portion of said second metal layer covering said high-k gate dielectric layer;

forming a polysilicon containing layer on said second metal layer;

removing a portion of said polysilicon layer selectively to said second metal layer to expose part of said second metal layer; and removing the exposed part of said second metal layer and the underlying part of said first metal layer selectively to said high-k gate dielectric layer by exposing said second metal layer and said first metal layer to a wet chemistry that comprises an aqueous solution that includes between about 0.5 and about 5.0 moles/liter of a hexa-dentate chelating agent that is selected from the group consisting of carboxylic acid based chelating agents, phosphonic acid based chelating agents, and phenol derivatives; wherein, said hexa-dentate chelating agent has a diameter that exceeds the combined thickness of said first and said second metal layers.

12. The method of claim 11 wherein said first metal layer has a workfunction that is between about 3.9 eV and about 4.2 eV, comprises a material that is selected from the group consisting of hafnium, zirconium, titanium, tantalum, aluminum, and a metal carbide, and serves as a gate electrode for an NMOS transistor, and said second metal layer has a workfunction that is between about 4.9 eV and about 5.2 eV, comprises a material that is selected from the group consisting of ruthenium, palladium, platinum, cobalt, nickel, and a conductive metal oxide, and serves as a gate electrode for a PMOS transistor.

13. The method of claim 11 wherein said first metal layer has a workfunction that is between about 4.9 eV and about 5.2 eV, comprises a material that is selected from the group consisting of ruthenium, palladium, platinum, cobalt, nickel, and a conductive metal oxide, and serves as a gate electrode for a PMOS transistor, and said second metal layer has a workfunction that is between about 3.9 eV and about 4.2 eV, comprises a material that is selected from the group consisting of hafnium, zirconium, titanium, tantalum, aluminum, and a metal oxide, and serves as a gate electrode for an NMOS transistor.

14. The method of claim 11 wherein less than about 100 angstroms of said second metal layer and the underlying part of said first metal layer are removed from beneath said polysilicon containing layer, when the exposed part of said second metal layer and the underlying part of said first metal layer are removed selectively to said high-k gate dielectric layer.

15. The method of claim 14 wherein less than about 50 angstroms of said second metal layer and the underlying part of said first metal layer are removed from beneath said polysilicon containing layer.

16. A method comprising:

forming a metal layer on a substrate, said metal layer having a thickness;

forming a mask on said metal layer wherein said mask exposes a portion of said metal layer; and applying a wet etchant that comprises at least one active etching ingredient to remove said exposed portion of said metal layer from said substrate, wherein all active etching ingredients have a diameter that exceeds said thickness of said metal layer, and wherein removal of said metal layer underneath said mask is blocked by said mask.

17. The method of claim 16 wherein said metal layer is between about 25 angstroms and about 50 angstroms thick.

18. The method of claim 17 wherein said metal layer comprises a material selected from the group consisting of hafnium, zirconium, titanium, tantalum, aluminum, ruthenium, palladium, platinum, cobalt, nickel, a metal carbide, and a conductive metal oxide.

19. The method of claim 18 wherein at least one active etching ingredient comprises a chelating agent selected from the group consisting of carboxylic acid based chelating agents, derivatives of phenol, and phosphonic acid based chelating agents.

20. A method comprising:

forming a metal layer on a substrate or a high-k gate dielectric layer, said metal layer having a thickness;

forming a mask on said metal layer wherein said mask exposes a portion of said metal layer; and applying a wet etchant that comprises at least one active etching ingredient to remove said exposed portion of said metal layer from said substrate, wherein all active etching ingredients have a diameter that exceeds said thickness of said metal layer, thereby preventing all active etching ingredients from significantly undercutting said metal layer underneath said masking layer.

21. The method of claim 20 wherein said undercutting is less than 100 angstroms.

22. The method of claim 21 wherein said undercutting is less than 100 angstroms, regardless of the duration of application of said wet etch chemistry.

23. The method of claim 20 wherein said metal layer is between about 25 angstroms and about 50 angstroms thick.

24. The method of claim 23 wherein said metal layer comprises a material selected from the group consisting of hafnium, zirconium, titanium, tantalum, aluminum, ruthenium, palladium, platinum, cobalt, nickel, a metal carbide, and a conductive metal oxide.

25. The method of claim 20 wherein said high-k gate dielectric layer comprises a material selected from the group consisting of hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate.

* * * * *